United States Patent
Quek et al.

(10) Patent No.: US 6,582,856 B1
(45) Date of Patent: Jun. 24, 2003

(54) SIMPLIFIED METHOD OF FABRICATING A RIM PHASE SHIFT MASK

(75) Inventors: Shyue Fong Quek, Petaling Jaya (ML); Ting Cheong Ang, Singapore (SG); Jun Song, Singapore (SG); Sang Yee Loong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/513,872

(22) Filed: Feb. 28, 2000

(51) Int. Cl.[7] .............................. G03F 9/00; G03C 5/00
(52) U.S. Cl. ........................................ 430/5; 430/323
(58) Field of Search ........................ 430/5, 322, 323, 430/324

(56) References Cited

U.S. PATENT DOCUMENTS

| | | | |
|---|---|---|---|
| 5,308,722 A | * 5/1994 | Nistler | 430/5 |
| 5,532,089 A | 7/1996 | Adair et al. | 430/5 |
| 5,582,939 A | 12/1996 | Pierrat | 430/5 |
| 5,620,817 A | 4/1997 | Hsu et al. | 430/5 |
| 5,955,222 A | 9/1999 | Hibbs et al. | 430/5 |
| 6,087,047 A | * 7/2000 | Mitsui et al. | 430/5 |

* cited by examiner

*Primary Examiner*—Mark F. Huff
*Assistant Examiner*—Saleha R. Mohamedulla
(74) *Attorney, Agent, or Firm*—George O. Saile; Rosemary L. S. Pike; Douglas R. Schnabel

(57) ABSTRACT

A new method of fabricating a rim phase shifting mask is achieved. An opaque layer is provided overlying a transparent substrate. A resist layer is deposited overlying the opaque layer. The resist layer is patterned. The opaque layer and the transparent substrate are etched. The resist layer masks this etching. The opaque layer is etched through during this etching. Notches are thereby etched into the transparent substrate at the edges of the opaque layer. These notches will cause a phase shift in incident light relative to incident light passing through regions in the transparent substrate adjacent to the notches. During this etching, an overetch is performed to remove any mask defects in the transparent substrate. Optionally, the notches may be etched into a phase shifting layer overlying the transparent substrate. An etch stopping layer may also be used in the phase shifting layer embodiment.

19 Claims, 6 Drawing Sheets

SIMPLIFIED METHOD OF FABRICATING A RIM PHASE SHIFT MASK

BACKGROUND OF THE INVENTION (1) Field of the Invention

The invention relates to a method of fabricating semiconductor structures, and more particularly, to a method of fabricating rim phase shifting masks (PSM) for use in manufacturing integrated circuit devices.

(2) Description of the Prior Art

The continued reduction in the physical dimensions of integrated circuit features challenges the capabilities of current art technologies. To overcome the limitations of the equipment and processes of the current art, new techniques for extending the capabilities of these equipment and processes are being developed. One such enhancement technique is the use of phase shifting masks. Phase shifting masks may be used, for example, to produce integrated circuit feature sizes of the same order of magnitude, or smaller, as the wavelength of light used in the photolithographic processing equipment.

In a typical, non-phase shifting, photolithographic mask, layer features are formed on the mask in an opaque material such as chrome. This chrome layer is formed overlying a transparent quartz substrate. Light is shown through this mask to expose a photosensitive material overlying the integrated circuit as defined by the mask pattern. After the photoresist is developed, the photoresist will reflect a copy or a reverse copy of the mask pattern.

As the pattern features of the circuits approach the wavelength of the exposure light, it becomes very difficult to successfully transfer the pattern features. This is due primarily to diffraction interference that occurs when the openings in the mask are nearly the same dimension as the wavelength of the light. In practice, it is found that the current 248 nanometer lithographic tools cannot reliably create patterns below 0.15 microns.

One approach to extending the capability of the current lithographic technology is the application of the aforementioned phase shifting masks (PSM). In a phase shifting mask, an additional component is added to the chrome and quartz system. Either through the application of an additional transparent layer or through the removal of a portion of the quartz layer to a specific depth, the optical properties are changed in a part of the transparent (not covered by chrome) sections of the mask. Specifically, when light of the lithographic wavelength is shown through the mask, a phase shift is created between light waves that pass through the phase shifting area and the light waves that pass through the non-phase shifting area. By shifting the phase of the light by 180 degrees, nodes, or cancellations of energy, will occur at opaque boundaries between the phase shifted and non-phase shifted areas. This principle is used to create more sharply defined boundary conditions during the photolithographic exposure. Sharper definition leads to improved pattern transfer.

The phase shifted mask principle may be applied using a rim-type PSM, or simply rim PSM, approach. In the rim PSM approach, a phase shifting structure is formed at every opaque (chrome) boundary. A "rim" of phase shifting structure is used along the entire pattern of the chrome to cause sharper pattern definition.

Referring now to FIG. 1, the construction of a prior art rim PSM mask is illustrated. A transparent substrate 10 is typically comprised of quartz. A phase shifting layer 14 overlies the transparent substrate. The phase shifting layer 14 is another transparent material, such as a spin-on glass, that is deposited to a thickness that will cause a 180 degree phase shift in the lithographic light. An opaque layer 18, typically chrome, overlies the phase shifting layer.

Referring now to FIG. 2, the opaque layer 18 and the phase shifting layer 14 are patterned. The openings formed in the opaque layer 18 and the phase shifting layer 14 correspond to the desired patterned required for the mask layer.

Referring now to FIG. 3, the rim structures are formed in the mask. The opaque layer 18 is etched to pull back the edges or boundaries of the chrome from the edges of the phase shifting layer 14. In practice, this etching involves either an explicit second photolithographic step and anisotropic downward etching of the chrome or an isotropic etching of the chrome using the same masking layer used for the pattern definition shown in FIG. 2. In either case, these rim structures are created by removing additional material from the opaque layer 18 to expose the phase shifting layer 14.

There are drawbacks to the process of the prior art. This process may require two masking steps that must be very carefully aligned. This is both expensive and time consuming. Conversely, if a single mask step is used, the isotropic under etch used to pull back the chrome is difficult to control.

Several prior art approaches concern methods to create phase shifting masks in the manufacture of integrated circuits. U.S. Pat. No. 5,955,222 to Hibbs et al discloses a rim PSM process. This process forms rim structures by both pulling back the opaque edges, as in the prior art, and by etching grooves in the transparent substrate. Only one photolithographic masking step is used in the method. The mask is used for creating the basic opaque layer pattern. Next, a hybrid photoresist layer, composed of both positive tone and negative tone resist, is applied and then exposed through the substrate of the partially formed mask. After resist development, the opaque edges are etched back and the substrate grooves are etched down. U.S. Pat. No. 5,620,817 to Hsu et al teaches a process to form self-aligned rim PSM. A phase shifting layer is first deposited and then patterned. A photoresist layer is then deposited and exposed through the substrate of the partially completed mask. The developed photoresist layer then defines where the opaque layer is anisotropically deposited. The final rim PSM does not use grooves or channels in the substrate. U.S. Pat. No. 5,582,939 to Pierrat discloses a method to form defect-free alternating aperture PSM (AAPSM). An opaque layer overlies a phase shifting layer. The opaque layer is first patterned. Next, the phase shifting layer is patterned using a second masking step. A third mask is used to again etch the phase shifting layer to remove any bump defects. U.S. Pat. No. 5,532,089 to Adair et al discloses a method to form rim PSM. The opaque layer is first patterned. Then, in one embodiment, sidewall spacers are formed on the opaque layer. Grooves are etched into the transparent substrate offset from the opaque layer by the sidewall spacers. The sidewall spacers are then removed, and the edges of the opaque layer are thus spaced back from the grooves of the substrate. In the second embodiment, an opaque layer immediately overlies an etch stopping layer. After the opaque layer patterning, a phase shifting layer is then applied overlying the opaque layer and the exposed etch stop layer. A second masking step is used to pattern the etch stop layer.

SUMMARY OF THE INVENTION

A principal object of the present invention is to provide an effective and very manufacturable method of fabricating rim phase shifting masks for use in the manufacture of integrated circuits.

A further object of the present invention is to provide a method of fabricating rim phase shifting masks where the rims are formed by etching notches in the transparent substrate.

Another further object of the present invention is to provide a method of fabricating rim phase shifting masks where the rims are formed by etching notches in a phase shifting layer.

A yet further object of the present invention is to provide a method of fabricating rim phase shifting masks using a single photolithographic masking step.

Another yet further object of the present invention is to provide a method of fabricating rim phase shifting masks using a single dry etching step.

In accordance with the objects of this invention, a new method of fabricating a rim phase shifting mask is achieved. An opaque layer is provided overlying a transparent substrate. A resist layer is deposited overlying the opaque layer. The resist layer is patterned. The opaque layer and the transparent substrate are etched. The resist layer masks this etching. The opaque layer is etched through during this etching. Notches, as in the form of sidewall trenches, are thereby etched into the transparent substrate at the edges of the opaque layer. These notches will cause a phase shift in incident light relative to incident light passing through regions in the transparent substrate adjacent to the notches. During this etching, an overetch is performed to remove any mask defects in the transparent substrate.

Also in accordance with the objects of this invention, a new method of fabricating a rim phase shifting mask is achieved. A transparent substrate is provided. A phase shifting layer is deposited overlying the transparent substrate. An opaque layer is deposited overlying the phase shifting layer. A resist layer is deposited overlying the opaque layer. The resist layer is patterned. The opaque layer and the phase shifting layer are etched. The resist layer masks this etching. The etch must have a high etch selectivity of the opaque layer to the phase shifting layer, which, in turn, must have a high selectivity to the transparent substrate. The opaque layer is etched through during this etching. Notches, as in the form of sidewall trenches, are thereby etched into the phase shifting layer at the edges of the opaque layer. These notches will cause a phase shift in incident light relative to incident light passing through regions in the phase shifting layer adjacent to the notches. During this etching, an overetch is performed to remove any mask defects in the phase shifting layer.

Also in accordance with the objects of this invention, a new method of fabricating a rim phase shifting mask is achieved. A transparent substrate is provided. A transparent etch stop layer is deposited overlying the transparent substrate. A phase shifting layer is deposited overlying the transparent etch stop layer. An opaque layer is deposited overlying the phase shifting layer. A resist layer is deposited overlying the opaque layer. The resist layer is patterned. The opaque layer and the phase shifting layer are etched. The resist layer masks this etching. The opaque layer is etched through during this etching. The transparent etch stop layer prevents etching into the transparent substrate. Notches, as in the form of sidewall trenches, are thereby etched into the phase shifting layer at the edges of the opaque layer. These notches will cause a phase shift in incident light relative to incident light passing through regions in the phase shifting layer adjacent to said notches. During this etching, an overetch is performed to remove any mask defects in the phase shifting layer.

BRIEF DESCRIPTION OF THE DRAWINGS

In the accompanying drawings forming a material part of this description, there is shown.

DESCRIPTION OF THE PREFERRED EMBODIMENTS

These embodiments disclose a method to form the rim phase shift masks for use in the manufacture of an integrated circuit device. It should be clear to those experienced in the art that the present invention can be applied and extended without deviating from the scope of the present invention.

Figure 1:
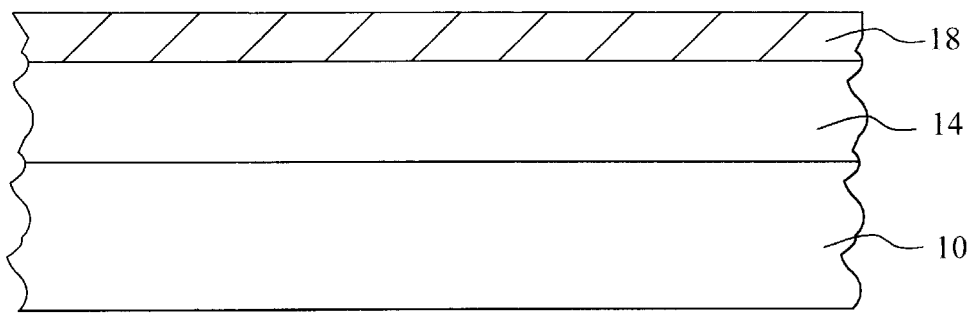
FIGS. 1 through 3 schematically illustrate a partially completed prior art rim PSM mask.
Figure 2:
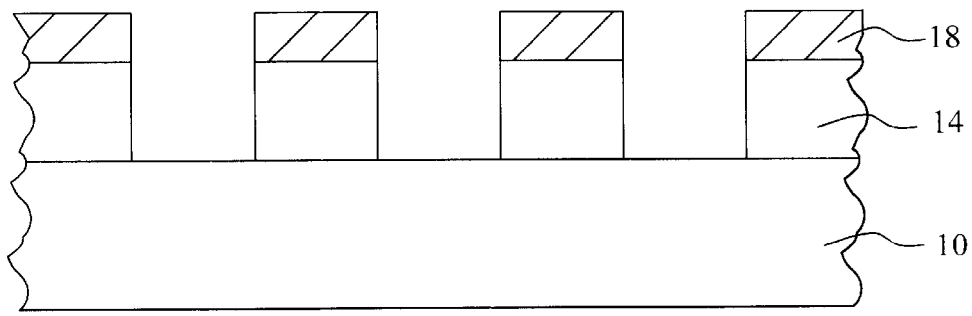
Figure 3:
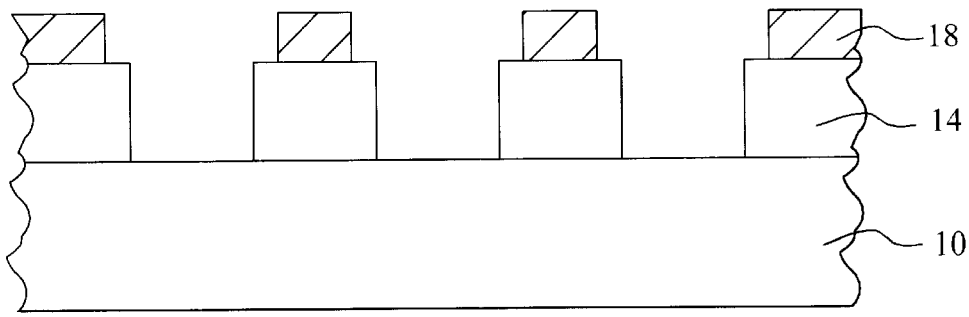
Figure 4:
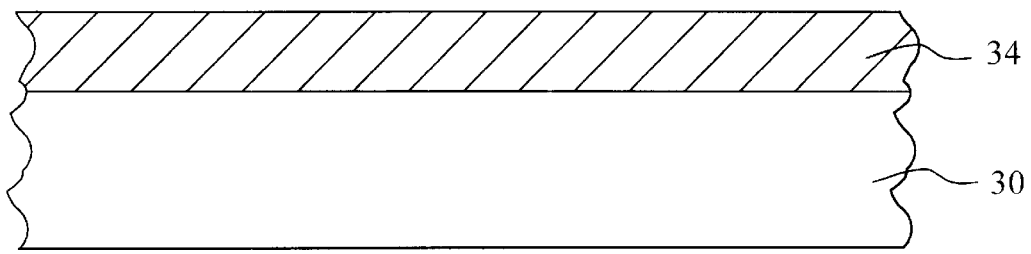
FIGS. 4 through 7 schematically illustrate in cross-sectional representation a first preferred embodiment of the present invention.

Referring now particularly to FIG. 4, there is shown a cross-section of a partially completed rim phase shifting mask of the first preferred embodiment of the present invention. A transparent substrate 30 is provided. The transparent substrate 30 comprises a material that passes incident light during the photolithographic exposure process. The transparent substrate 30 preferably comprises quartz. Depending on the type of light source used in the production photolithographic process, the transparent substrate 30 may comprise silicon carbide (SiC). An opaque layer 34 is deposited overlying the transparent substrate 30. The opaque layer 34 comprises a material that does not allow the passage of incident light during the photolithographic exposure process. The opaque layer 34 may comprise chromium, chromium alloys, molybdenum, aluminum, tungsten, titanium, molybdenum silicide or carbon. The opaque layer 34 may comprise a multi-layer combination of silicon compounds alloyed with chromium, chromium alloys, molybdenum, aluminum, tungsten, titanium, molybdenum silicide or carbon. Preferably, the opaque layer comprises chromium alloys, or simply chrome.

Figure 5:
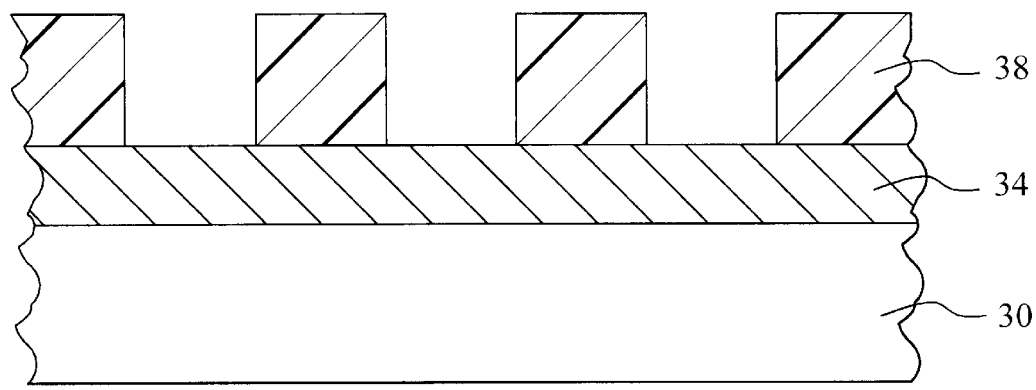

Referring now to FIG. 5, a resist layer 38 is deposited overlying the opaque layer 34. The resist layer 38 comprises a polymer material that will change properties when exposed to energy during a lithographic process. The resist layer 38 may comprise material that reacts, or is activated, when exposed to light, such as that of a laser. This would constitute optically activated resist or photoresist. In addition, the resist layer 38 may comprise material that is activated through exposure to electron beam radiation. The resist layer 38 is patterned as shown in the illustration. The patterning step is performed by exposing the resist layer 38 by either optical lithography or by electron beam lithography. Following the exposure step, the resist layer 38 is developed so that part of the material is removed as defined by the mask. The removal of apart of the resist layer 38 thereby exposes a part of the opaque layer 34.

Figure 6:
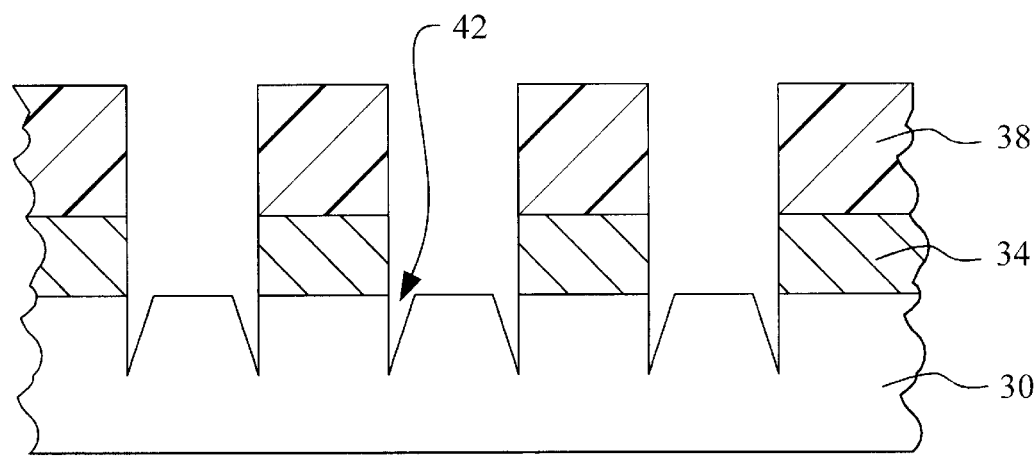

Referring now to FIG. 6, an important feature of the first preferred embodiment is shown. The opaque layer 34 and the transparent substrate 30 are etched. This etching is anisotropic and downward in direction and occurs only where defined by the resist layer 38. Note that, while the opaque layer 34 is entirely etched through, only notches, or trenches 42, are etched into the transparent substrate 30. The etching process used to achieve this effect comprises an etching chemistry of chlorine-containing gas or bromine-containing gas combined with argon for bombardment. A high ratio of chlorine to argon is used so that $CH_xCl_y$ polymer formation is minimized. By reducing the $CH_xCl_y$ polymer formation on sidewalls, trenches 42 are rapidly formed through the microloading effect.

The microloading etch effect plays an important role in the formation of the trenches 42. Therefore, temperature, pressure, and gas flows are carefully controlled. The micro-trench formation is typically an undesirable effect when encountered in polysilicon etching, for example. However, in the present invention, the microloading effect is desired and is carefully controlled to create trenches 42 for a unique fabrication of a rim-type phase shift mask.

Due to the presence of the high resist wall, many of the non-directional particles are reflected back to the quartz surface near the foot of the wall. By comparison, far fewer particles are directed to wide-open surfaces. Therefore, the etch rate near the foot of the resist is much higher than the etch rate in open areas. This is the microloading effect that causes the formation of micro-trenches 42.

The notches 42 that are etched in the transparent substrate 30 have the effect of causing a phase shift in incident light relative to incident light passing through regions in the transparent adjacent to the notches 42. The notches 42 thereby form a phase shifting rim around the pattern of the opaque layer 34. The difference in reflective index of the transparent substrate 30 and that of air causes an optical path difference leading to an optical phase shift. The notches 42 are preferably etched to a depth of between about 5900 Angstroms and 6200 Angstroms if the mask will be used in an I-line stepper. If a deep ultraviolet (DUV) system is used, then the notches 42 are etched to a depth of between about 2620 Angstroms and 2820 Angstroms. The depth of the notches is given by the equation:

$$d=i\lambda/2(n_{30}-1),$$

where i is an odd integer, $\lambda$ is the wavelength of the photolithographic system, and $n_{30}$ is the reflective index of the transparent substrate 30.

A print down of the completed image may then be performed to capture any defects in the transparent substrate 30. The print down image can be compared to the original image in the database. An overetch of the transparent substrate 30 can then be performed to remove any defects on the surface of the transparent substrate 30. The capability to repair these defects is a significant advantage of the present invention.

Figure 7:
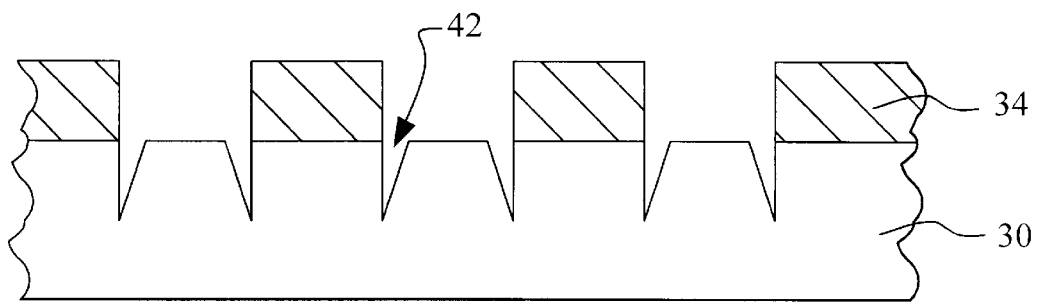

Referring now to FIG. 7, the resist layer 38 is removed to complete the rim PSM. The resist layer 38 is removed using a conventional stripping process such as oxygen ashing or wet stripping.

Figure 8:
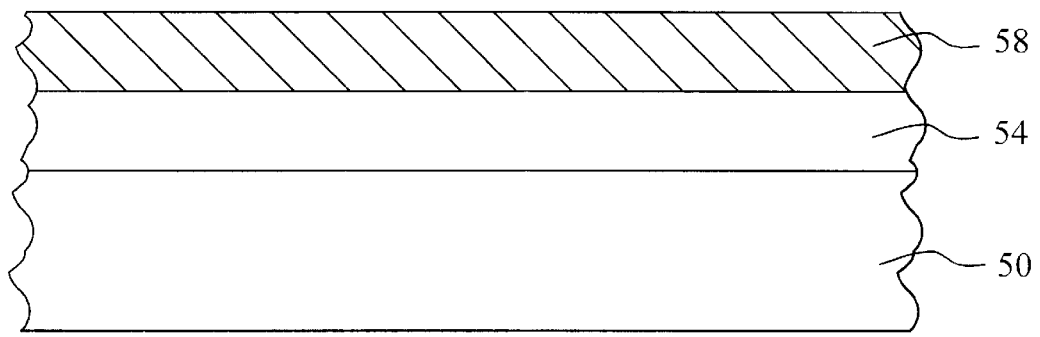
FIGS. 8 through 11 schematically illustrate in cross-sectional representation a second preferred embodiment of the present invention.

Referring now to FIG. 8, a second preferred embodiment of the present invention is illustrated. A transparent substrate 50 is provided. The transparent substrate 50 comprises a material that passes incident light during the photolithographic exposure process. The transparent substrate 50 preferably comprises quartz. A phase shifting layer 54 is deposited overlying the transparent substrate 50. The phase shifting layer 54 preferably comprises a light passing material such as silicon dioxide. The phase shifting layer 54 thickness is determined by the equation:

$$t=i\lambda/2(n_{54}-1),$$

where i is an odd integer, $\lambda$ is the wavelength of the photolithographic system, and $n_{54}$ is the reflective index of the phase shifting layer 54. The thickness of the phase shifting layer 54 of the second embodiment is important and can be well controlled with current deposition technology.

An opaque layer 58 is deposited overlying the phase shifting layer 54. The opaque layer 58 comprises a material that does not allow the passage of incident light during the photolithographic exposure process. The opaque layer 58 may comprise chromium, chromium alloys, molybdenum, aluminum, tungsten, titanium, molybdenum silicide or carbon. The opaque layer 58 may comprise a multi-layer combination of silicon compounds alloyed with chromium, chromium alloys, molybdenum, aluminum, tungsten, titanium, molybdenum silicide or carbon. Preferably, the opaque layer 58 comprises chromium alloys, or simply chrome.

Figure 9:
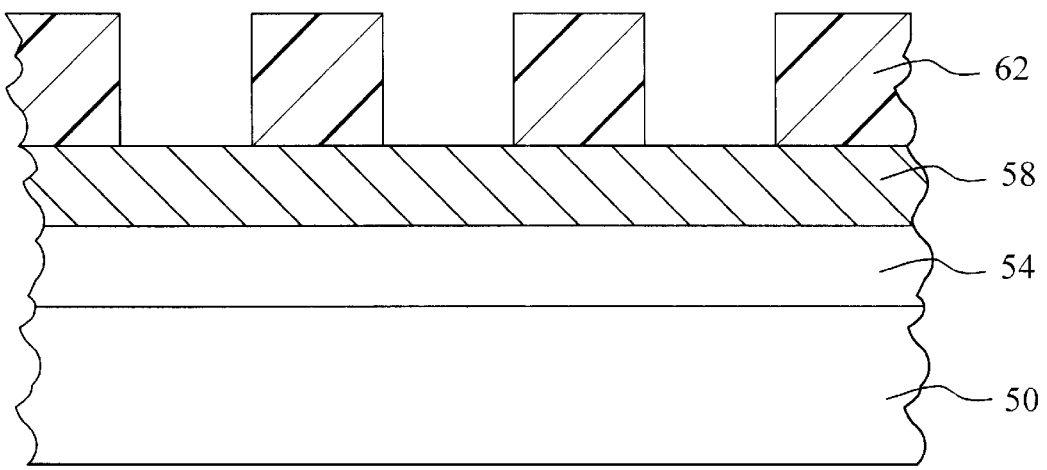

Referring now to FIG. 9, a resist layer 62 is deposited overlying the opaque layer 58. The resist layer 62 again comprises a polymer material that will change properties when exposed to energy during a lithographic process. The resist layer 62 is either light activated or electron beam activated. The resist layer 62 is patterned as shown in the illustration. Following the exposure step, the resist layer 62 is developed so that part of the material is removed as defined by the mask. The removal of part of the resist layer 62 thereby exposes a part of the opaque layer 58.

Figure 10:
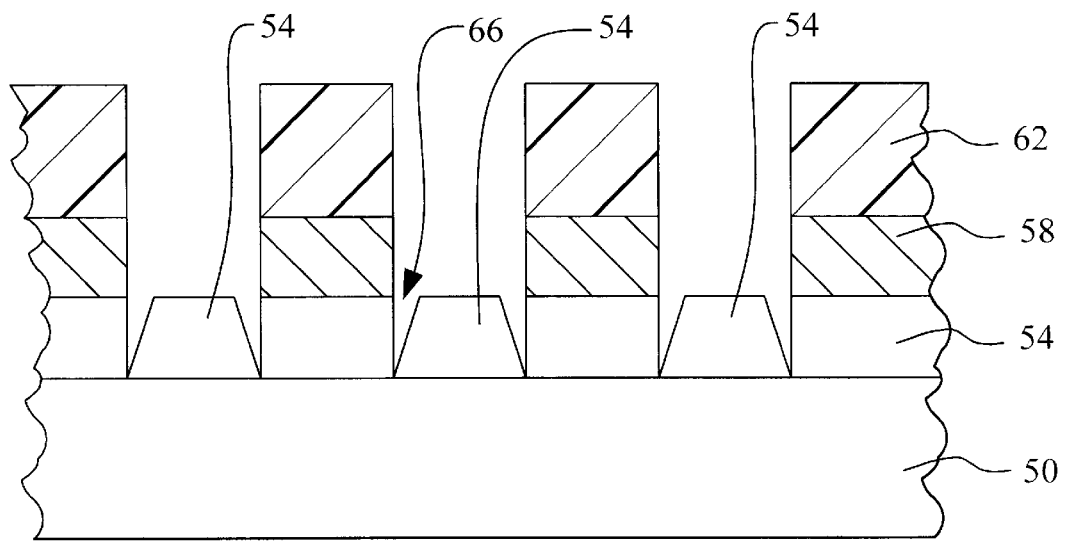

Referring now to FIG. 10, an important feature of the second embodiment of the present invention is demonstrated. The opaque layer 58 and the phase shifting layer 54 are etched. This etching is anisotropic and downward in direction and occurs only where defined by the resist layer 62. Note again that, while the opaque layer 58 is entirely etched through, only notches 66 are etched into the phase shifting layer 54. The etch is stopped at the transparent substrate layer 50. The etching process comprises chlorine-containing gases or bromine-containing gases with argon for bombardment. The etching process is optimized so that the phase shifting layer 54 has a higher etch rate than the transparent substrate layer 50. This facilitates stopping the etch at the transparent substrate layer 50. If the phase shifting layer 54 comprises an impurity doped oxide, such as BPSG, then the etch rate for the phase shifting layer 54 is much higher than that of a quartz-composed transparent substrate layer 50.

As in the first embodiment, the microloading effect is important in the formation of the micro-trenches 66. The amount of microloading effect can be affected by the pattern density. Therefore, structures such as assisted bar or scattering bar can be used to make the pattern density more uniform across the integrated circuit. In addition, the temperatures, pressures, and gas flows must be well regulated to create uniform notches 66.

The notches 66 that are etched in the phase shifting layer 54 have the effect of causing a phase shift in incident light relative to incident light passing through regions in the phase shifting layer 54 adjacent to the notches 66. The notches 66 thereby form a phase shifting rim around the pattern of the opaque layer 58. The depth of the notches 66 corresponds to the depth of the phase shifting layer 54. These notches 66 (or trenches), which surround the pattern, form something like an outline surrounding the pattern. The outline phase shifts the incident light 180 degrees out of phase. Therefore, a sharper pattern edge is formed with respect to the field intensity. This improves the image resolution.

As in the first embodiment, defects can be detected by performing a print down to photoresist on a wafer. If defects are detected, an overetch is performed during the etching process to remove any defects in the phase shifting layer 54.

Note that for an overetch to be used, the thickness of the phase shifting layer 54, must be considered at the deposition stage.

Figure 11:
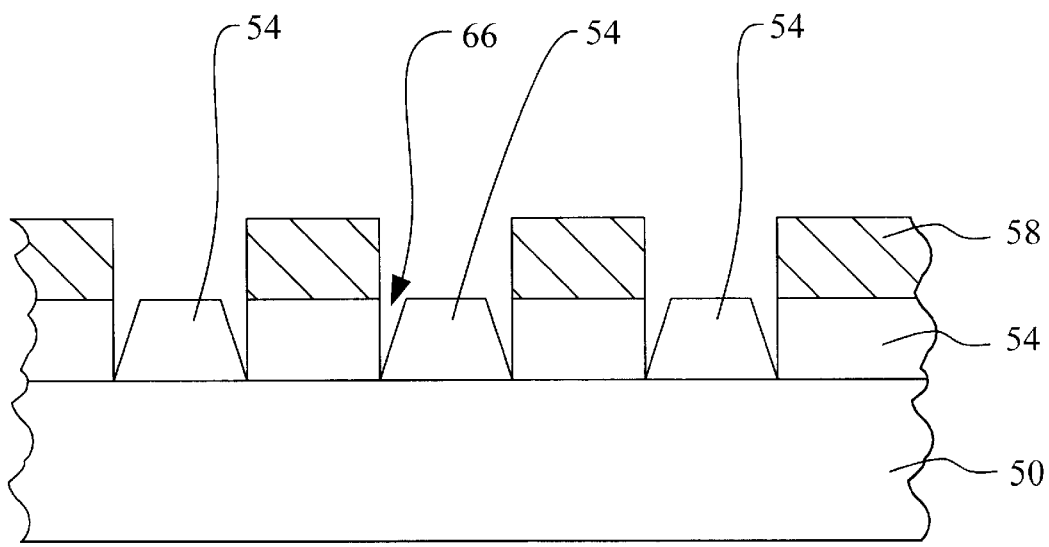

Referring now to FIG. 11, the resist layer 62 is removed to complete the rim PSM. The resist layer 62 is removed using a conventional stripping process such as oxygen ashing or wet stripping.

Figure 12:
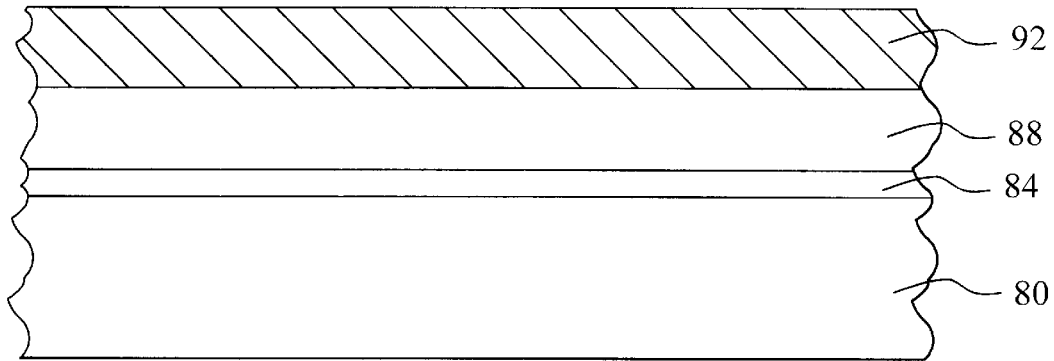
FIGS. 12 through 15 schematically illustrate in cross-sectional representation a third preferred embodiment of the present invention.

Referring now to FIG. 12, a third preferred embodiment of the present invention is illustrated. A transparent substrate 80 is provided. The transparent substrate 80 comprises a material that passes incident light during the photolithographic exposure process. The transparent substrate 80 preferably comprises quartz. A transparent etch stop layer 84 is deposited overlying the transparent substrate 80. This transparent etch stop layer 84 will prevent the etching process used to define the mask from encroaching upon the transparent substrate 80. The transparent etch stop layer 84 comprises a material such as silicon nitride or silicon oxynitride.

A phase shifting layer 88 is deposited overlying the transparent etch stop layer 84. The phase shifting layer 88 preferably comprises a light passing material such as silicon dioxide. The phase shifting layer 88 is preferably silicon dioxide deposited to a thickness given by the equation:

$$t = i\lambda/2(n_{84}-1),$$

where i is an odd integer, $\lambda$ is the wavelength of the photolithographic system, and $n_{84}$ is the reflective index of the transparent etch stop layer 84.

An opaque layer 92 is deposited overlying the phase shifting layer 88. The opaque layer 92 comprises a material that does not allow the passage of incident light during the photolithographic exposure process. The opaque layer 92 may comprise chromium, chromium alloys, molybdenum, aluminum, tungsten, titanium, molybdenum silicide or carbon. The opaque layer 92 may comprise a multi-layer combination of silicon compounds alloyed with chromium, chromium alloys, molybdenum, aluminum, tungsten, titanium, molybdenum silicide or carbon. Preferably, the opaque layer 92 comprises chromium alloys, or simply chrome.

Figure 13:
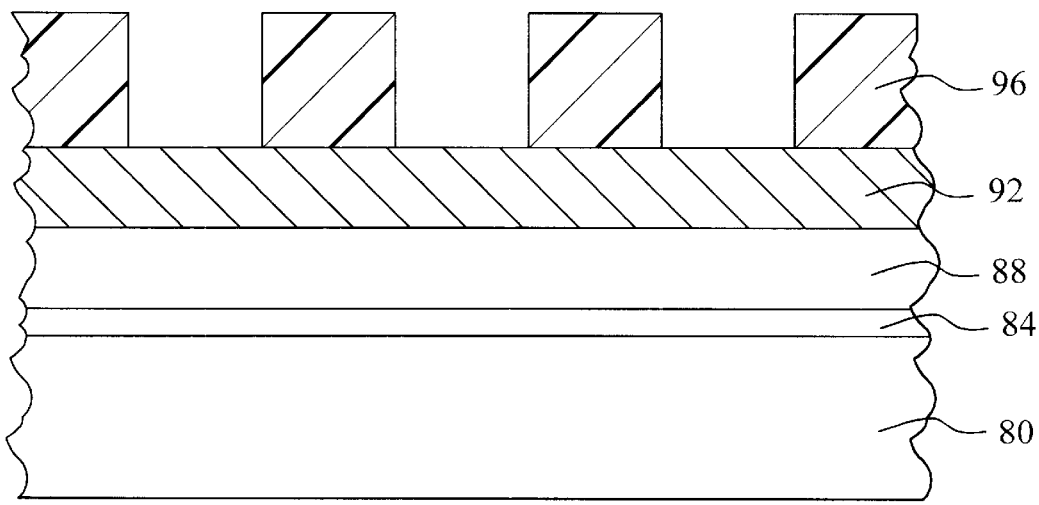

Referring now to FIG. 13, a resist layer 96 is deposited overlying the opaque layer 92. The resist layer 96 again comprises a polymer material that will change properties when exposed to energy during a lithographic process. The resist layer 96 is either light activated or electron beam activated. The resist layer 96 is patterned as shown in the illustration. Following the exposure step, the resist layer 96 is developed so that part of the material is removed as defined by the mask. The removal of part of the resist layer 96 thereby exposes a part of the opaque layer 92.

Figure 14:
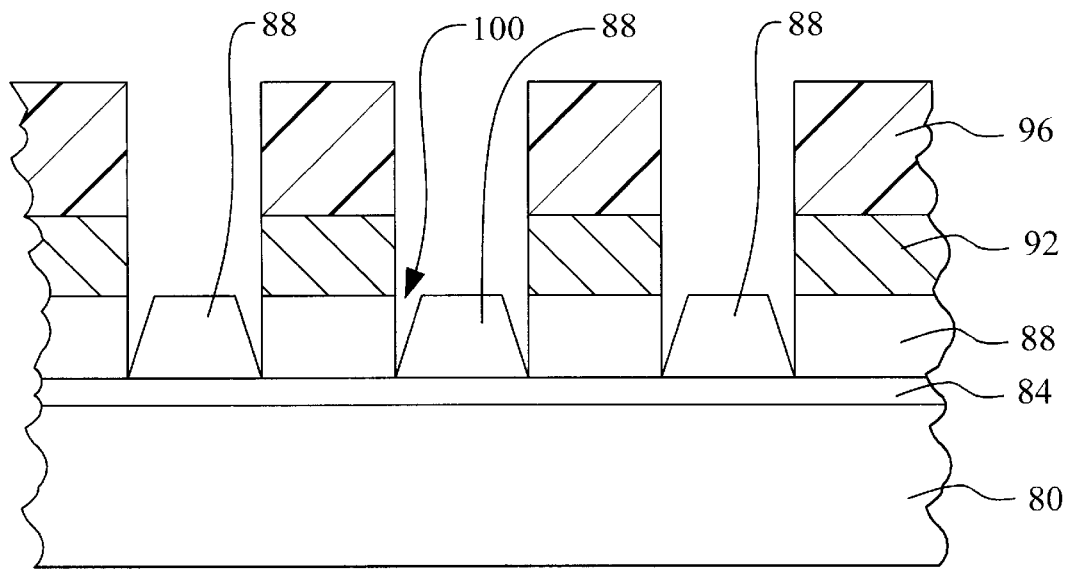

Referring now to FIG. 14, an important feature of the third embodiment of the present invention is demonstrated. The opaque layer 92 and the phase shifting layer 88 are etched. This etching is anisotropic and downward in direction and occurs only where defined by the resist layer 96. Note again that, while the opaque layer 92 is entirely etched through, only notches 100 are etched into the phase shifting layer 88. The etching process comprises chlorine-containing gases or bromine-containing gases with argon for bombardment. The etching process is optimized so that the phase shifting layer 88 has a much higher etch rate than the transparent etch stopping layer 84. This facilitates stopping the etch at the transparent etch stopping layer 84.

The microloading effect is very important once again. To achieve uniform results across the integrated circuit, uniform pattern density is preferred. Structures like assisted bar and scattering bar can be used to improve the pattern uniformity. In addition, careful control of temperature, pressure, and gas flow is required.

The notches 100 that are etched in the phase shifting layer 88 have the effect of causing a phase shift in incident light relative to incident light passing through regions in the phase shifting layer 88 adjacent to the notches 100. The notches 100 thereby form a phase shifting rim around the pattern of the opaque layer 92. The notches 100 are preferably etched to a depth that corresponds to the thickness of the phase shifting layer 88. The notches 100 perform the phase shifting function as described in the second embodiment.

As in the second embodiment, defects can be detected by performing a print down. Detected defects can then be removed by an overetch of the phase shifting layer 88. Note that, if an overetch is needed, this must be accounted for in the phase shifting layer 88 deposition thickness.

Figure 15:
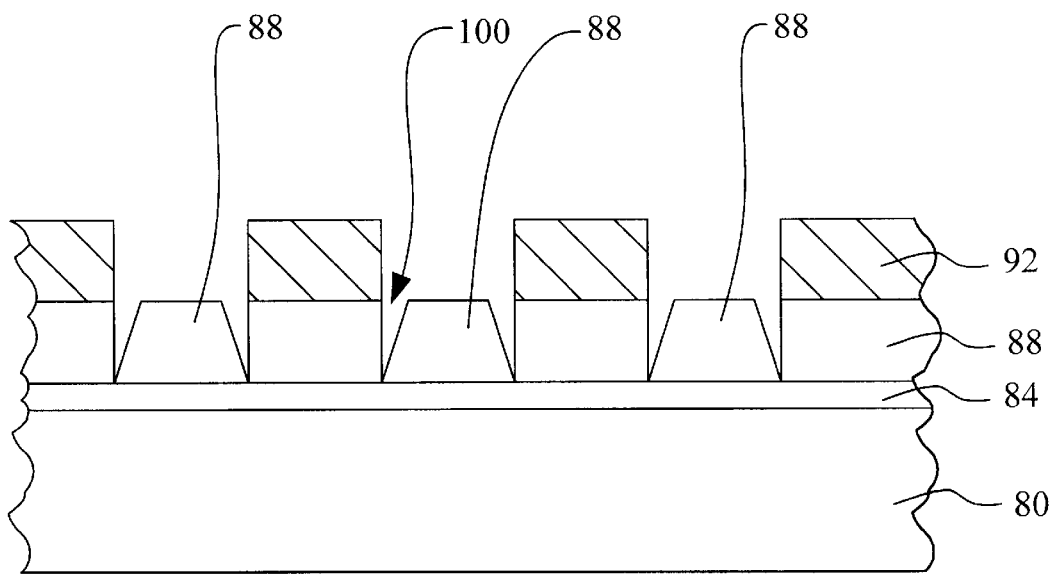

Referring now to FIG. 15, the resist layer 96 is removed to complete the rim PSM. The resist layer 96 is removed using a conventional stripping process such as oxygen ashing or wet stripping.

As shown in the preferred embodiments, the present invention provides a very manufacturable process for fabricating a rim phase shift mask (PSM) for use in the manufacture of an integrated circuit device. The method etches notches adjacent to opaque layer boundaries to create a phase shifting rim about those boundaries. The method only requires a single lithographic masking step. The method only requires a single etching process. Finally, the method may be applied in any of three preferred embodiments.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a phase shifting mask for use in the manufacture of an integrated circuit device comprising:

providing a transparent substrate;

depositing a contiguous, non-patterned opaque layer overlying said transparent substrate wherein said opaque layer consists of a multi-layer combination of silicon compounds alloyed with one of the group consisting of: chromium, chromium alloys, molybdenum, aluminum, tungsten, titanium, molybdenum silicide and carbon;

thereafter depositing a resist layer overlying said opaque layer;

thereafter patterning said resist layer;

thereafter etching said opaque layer and said transparent substrate to thereby pattern said opaque layer and to form notches in said transparent layer wherein said resist layer masks said etching, wherein said opaque layer is etched through, wherein notches are etched into said transparent substrate only at each of the edges of said opaque layer, wherein said notches cause a phase shift in incident light relative to incident light passing through regions in said transparent substrate adjacent to said notches, and wherein an overetch is performed during said etching to remove any mask defects in said transparent substrate; and removing said resist layer to complete said phase shifting mask in the manufacture of said integrated circuit device.

2. The method according to claim 1 wherein said transparent substrate comprises quartz.

3. The method according to claim 1 wherein said opaque layer comprises one of the group of: chromium, chromium alloys, molybdenum, aluminum, tungsten, titanium, molybdenum silicide and carbon.

4. The method according to claim 1 wherein said step of patterning said resist layer is by one of the group of: optical lithography and electron beam lithography.

5. The method according to claim 1 wherein said step of etching said opaque layer and said transparent substrate is by a dry etching process comprising one of the group of: chlorine-containing gas with argon and bromine-containing gas with argon.

6. A method of fabricating a phase shifting mask for use in the manufacture of an integrated circuit device comprising:

providing a transparent substrate;

depositing a phase shifting layer overlying said transparent substrate;

depositing an opaque layer overlying said phase shifting layer;

depositing a resist layer overlying said opaque layer;

patterning said resist layer;

etching said opaque layer and said phase shifting layer wherein said resist layer masks said etching, wherein said opaque layer is etched through, wherein notches are etched into said phase shifting layer at the edges of said opaque layer, wherein said notches cause a phase shift in incident light relative to incident light passing through regions in said phase shifting layer adjacent to said notches, and wherein an overetch is performed during said etching to remove any mask defects in said phase shifting layer; and removing said resist layer to complete said phase shifting mask in the manufacture of said integrated circuit device.

7. The method according to claim 6 wherein said transparent substrate comprises quartz.

8. The method according to claim 6 wherein said phase shifting layer comprises silicon dioxide.

9. The method according to claim 6 wherein said opaque layer comprises one of the group of: chromium, chromium alloys, molybdenum, aluminum, tungsten, titanium, molybdenum silicide and carbon.

10. The method according to claim 6 wherein said opaque layer comprises a multi-layer combination of silicon compounds alloyed with one of the group of: chromium, chromium alloys, molybdenum, aluminum, tungsten, titanium, molybdenum silicide and carbon.

11. The method according to claim 6 wherein said step of patterning said resist layer is by one of the group of: optical lithography and electron beam lithography.

12. The method according to claim 6 wherein said step of etching said opaque layer and said phase shifting layer is by a dry etching process comprising one of the group of: chlorine-containing gas with argon and bromine-containing gas with argon.

13. A method of fabricating a phase shifting mask for use in the manufacture of an integrated circuit device comprising:

providing a transparent substrate comprising quartz;

depositing a transparent etch stop layer overlying said transparent substrate;

depositing a phase shifting layer overlying said transparent etch stop layer;

depositing an opaque layer overlying said phase shifting layer;

depositing a resist layer overlying said opaque layer;

patterning said resist layer;

etching said opaque layer and said phase shifting layer wherein said resist layer masks said etching, wherein said opaque layer is etched through, wherein said transparent etch stop layer prevents etching into said transparent substrate, wherein notches are etched into said phase shifting layer at the edges of said opaque layer, wherein said notches cause a phase shift in incident light relative to incident light passing through regions in said phase shifting layer adjacent to said notches, and wherein an overetch is performed during said etching to remove any mask defects in said phase shifting layer; and removing said resist layer to complete said phase shifting mask in the manufacture of said integrated circuit device.

14. The method according to claim 13 wherein said transparent etch stop layer comprises one of the group of: silicon nitride and silicon oxynitride.

15. The method according to claim 13 wherein said phase shifting layer comprises silicon dioxide.

16. The method according to claim 13 wherein said opaque layer comprises one of the group of: chromium, chromium alloys, molybdenum, aluminum, tungsten, titanium, molybdenum silicide and carbon.

17. The method according to claim 13 wherein said opaque layer comprises a multi-layer combination of silicon compounds alloyed with one of the group of: chromium, chromium alloys, molybdenum, aluminum, tungsten, titanium, molybdenum silicide and carbon.

18. The method according to claim 13 wherein said step of patterning said resist layer is by one of the group of: optical lithography and electron beam lithography.

19. The method according to claim 13 wherein said step of etching said opaque layer and said phase shifting layer is by a dry etching process comprising one of the group of: chlorine-containing gas with argon and bromine-containing gas with argon.

* * * * *